United States Patent [19]

Rickus et al.

[11] Patent Number: 4,495,375
[45] Date of Patent: Jan. 22, 1985

[54] MIS OR SIS SOLAR CELLS

[75] Inventors: Edmund Rickus, Oestrich-Winkel; Karlheinz Jäger, Kronberg, both of Fed. Rep. of Germany

[73] Assignee: Battelle-Institut e.V., Frankfurt, Fed. Rep. of Germany

[21] Appl. No.: 531,718

[22] Filed: Sep. 13, 1983

[30] Foreign Application Priority Data

Sep. 18, 1982 [DE] Fed. Rep. of Germany ....... 3234678

[51] Int. Cl.$^3$ .............................................. H01L 31/06
[52] U.S. Cl. ..................... 136/255; 29/572; 136/260; 136/265; 357/15; 357/30
[58] Field of Search ........... 136/255, 260, 265; 29/572; 148/188; 357/15, 30

[56] References Cited

U.S. PATENT DOCUMENTS 3,990,097 11/1976 Lindmayer ............................ 357/30
4,338,482 7/1982 Gordon ................................ 136/256

OTHER PUBLICATIONS

D. Bonnet et al., "The CdSe Thin-Film Solar Cell", Conf. Record, 14th IEEE Photovoltaic Specialists Conf. (1980), pp. 629-632.

Primary Examiner—Aaron Weisstuch
Attorney, Agent, or Firm—Birch, Stewart, Kolasch & Birch

[57] ABSTRACT

The function of the insulating film in MIS and SIS solar cells can also be fulfilled by a semiconductor with a sufficiently large energy gap. The doping of the quasi insulating layer guarantees good fill factors and short-circuit current densities also at a relatively high film thickness. For cadmium selenide solar cells with a quasi insulating film made of zinc selenide, copper is preferably used as a doping material.

14 Claims, 1 Drawing Figure

MIS OR SIS SOLAR CELLS

BACKGROUND OF THE INVENTION

1. Field of the Invention

The invention relates to a solar cell with metal/quasi insulator/semiconductor (MIS) or semiconductor/quasi insulator/semiconductor (SIS) layer arrangement where the quasi insulating layer consists of a high resistance semiconductor material.

2. Prior Art

MIS and SIS solar cells are known. In principle, their function is similar to that of a Schottky diode (metal/semiconductor contact); their photovoltaic characteristics are, however, improved by the addition of a extremely thin insulating film. In general, the insulating film consists of a natural oxide of the semiconductor. The thickness of the insulating film is chosen in a way that the additional potential barrier caused by it hinders the minority carrier flow from the semiconductor into the metal. On the other side, however, the minority carriers must still be able to cross the additional barrier without impairing the fill factor and the short-circuit current of the solar cells. This requires a technologically extensive, very precise and regular control and adjustment of the thickness of the insulating film at a very low level of around 2 nm.

Because of reproducibility, simplicity and time savings factors, it is desirable to use a physically deposited heterogeneous insulating material. Because of the extremely low thickness of the insulating layer, however, variations of the film thickness of pinholes (microscopic holes) within the insulating film may be caused by a relatively small roughness on the surface of the photoelectrically active semiconductor and/or by extremely small dust particles. They have a very negative effect on the photovoltaic characteristics of the SIS or MIS solar cells, and special protective measures are required. It is, therefore, appropriate to use thicker insulating films which, however, will not impair the fill factor and the short circuit current of the solar cells when under the impact of light.

It is known that the function of an insulator in SIS and MIS solar cells can also be fulfilled by a semiconductor with a sufficiently large energy gap so that a contact/semiconductor/quasi insulating semiconductor/basis semiconductor structive is formed. In this way, e.g. Au/ZnSe/CdSe thin layer solar cells have already been described (D. Bonnet and E. Rickus, The CdSe Thin Film Solar Cell, *Proc. 14th IEEE Photovolt. Specialists Conf.*, 1980, page 629). The use of an approx. 3.5 nm thick ZnSe film as a quasi insulator semiconductor results when under the impact of light, in short circuit current densities of approx. 18 mA/cm$^2$ and in fill factors of approx. 55%.

The relatively low open circuit voltage of approx. 0.4 V is caused by partial short circuits due to surface roughness or pinholes between the cadmium selenide and the Schottky contact. An increase of the thickness of the zinc selenide film to approx. 5 nm increases the open circuit voltage to values of around 0.6 V. While the short circuit current remains practically unchanged, the fill factor drops to values about 45%.

BROAD DESCRIPTION OF THE INVENTION

It is the object of the present invention to create an SIS or MIS solar cell which does not cause the above-mentioned difficulties in production, and which has a simple configuration and a high efficiency. In particular, the reduction of the fill factor in the event of known cadmium selenide/zinc selenide/gold thin film solar cells with a 5 nm zinc selenide film should be avoided.

The objects and advantages of the invention are achieved by doping or treating the quasi insulating layer with a material by which the additional potential barrier caused by it, can more easily be overcome by the appropriate minority carriers.

An ideal insulating film in SIS and/or MIS solar cells must create the highest possible potential barrier for majority carriers, and at the same time, it should not hinder the minority carrier transport. In particular, it should prevent, as far as possible, the recombination of the photogenerated carriers. The invention determines that it is possible to reach this ideal state rather closely with Schottky contact/quasi insulator/basis semiconductor structures by the doping of the quasi insulating film. The doping is chosen in a way such that, on the one hand, the number of free carriers in the quasi insulating film still remains sufficiently small, while on the other hand, however, the possibly due to the shifting of the Fermi level, the energetic shifting of the potential barriers takes place in a way so that the transfer of the majority carrier out of the basis semiconductor into the contact material is strongly impaired by an increased barrier, and at the same time, the transfer of minority carriers is facilitated by the reduction of the barrier and/or by a reduction of the recombination possibility. Even in the event of relatively thick quasi insulating films, good short circuit currents and fill factors can still be achieved. The deposition of thicker films of such insulators or quasi insulators has also a positive influence on the open circuit voltage apart from technological advantages, such as increased reproducibility, resistance to surface roughnesses and variations of the film thickness. As it is possible in accordance with the present invention to use thicker quasi insulating films, the solar cell will technically be easy to realize. For cadmium selenide MIS solar cells with a quasi insulating film consisting of zinc selenide, the suitable doping materials are silver, antimony, gold, arsenic, and in particular, copper.

With the doping material being copper which forms acceptor levels in zinc selenide with an ionisation energy of about 0.6 eV, especially good results are reached. Cadmium selenide MIS thin film solar cells with a 5 nm thickness and with a copper doped ZnSe film have, under the impact of light, fill factors of around 60%, short circuit current densities of approx. 18 mA/cm$^2$, and open circuit voltages of more than 0.6 V, i.e. a clearly increased efficiency. Even when using 7 nm thick doped zinc selenide films, fill factors of 55% can be reached.

The doping of the quasi insulating film can be carried out in a known manner. Preferably the doping is achieved by an in-diffusion of a very thin film of the doping material which is deposited on the insulating film, e.g. by vacuum evaporation. The film made of the doping material has a thickness of 0.1–1 nm, preferably 0.5 nm and is applied on a zinc selenide layer having a thickness of 2 to 10 nm, preferably 5 nm. After the deposition of this film, a heat treatment at suitable temperature is carried out. This heat treatment can also be carried out, when the entire solar cell has been completed at a temperature between 130° and 170° C. The use of other known doping methods, such as the simultaneous deposition of the doping material during the production of cells, and the implantation of ions or the deposition of already doped zinc selenide is also possible.

DETAILED DESCRIPTION OF THE INVENTION

Figure 1:
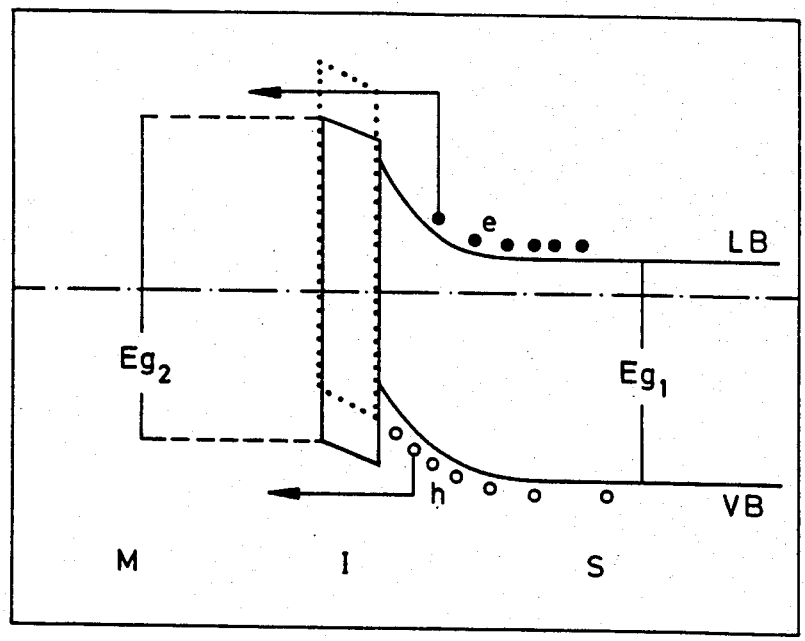

A possible explanation of the effect achieved by the doping in accordance with the invention, is given in FIG. 1, which shows the energy band pattern of an MIS solar cell. The symbols have the following meanings:

LB: conductivity band
VB: valence band
$Eg_1$: energy gap of the basis semiconductor
$Eg_2$: energy gap of the insulating material
e: electrons, and
h: holes.

The material I is normally an insulator or a semiconductor with a high energy gap which, therefore, is very similar to an insulator. Its energy gap $Eg_2$ represents an additional potential barrier for the overflow of electrons and holes from the base material—semiconductor S—into the metal M in the event of MIS cells and/or into a semiconductor in the event of SIS cells. In FIG. 1 this overflow is shown with arrows. By the doping of the insulating layer, the potential barrier caused by it will be shifted, as shown by the dotted lines. Thereby, the overflow of the majority carriers (here: electrons e) into the metal is hindered, and the overflow of the minority carriers (here: holes h) is facilitated, resulting in an increased fill factor. The doping of the quasi insulating layer in accordance with the present invention is described in detail as follows:

A cadmium selenide MIS thin film solar cell is produced in the known manner by the vacuum evaporation of a series of films, consisting of chromium back contact/CdSe/ZnSe/Au (E. Rickus, Development of Cadmium Selenide Thin Film Solar Cells, Research Report BMFT-FB-T 81-109, 1981, and D. Bonnet and E. Rickus, The CdSe Thin Film Solar Cell, *Proc. 14th IEEE Photovolt. Specialists Conf.*, 1980, page 629). Before the deposition of the gold film, however, in a vacuum of some $10^{-6}$ Torr, a 0.5 nm thick copper film is evaporated on the 5 nm thick ZnSe film with an evaporation rate of approx. 0.1 nm/s. The substrate remains unheated. The thickness of the film is controlled—in the known manner—with an oscillator crystal arranged near to the substrate. The frequency changes of the oscillator crystal during the evaporation indicates the thickness of the film. After the Cu deposition, the cell is completed—in the known manner—by the deposition of an Au film, a current collecting grid, and, if required, an antireflection film, e.g. of ZnS. For the penetration of copper and for the improvement of photovoltaic properties, the entire cell is then, in the last production step, annealed at approx. 150° C. for approx. half an hour under a flow of nitrogen (purity 99.99%).

The term "quasi insulator" used in connection with the description of the present invention, means a highly resistant material which, however, in an extreme case, can also be an electrically nonconductive material.

What is claimed is:

1. A solar cell with metal layer-quasi insulator-semiconductor (MIS) or semiconductor-quasi insulator-semiconductor (SIS) layer arrangement where the quasi insulating layer consists of a high-resistance semiconductor material, characterized in that the quasi insulating layer is doped with a material which makes it easier for the appropriate minority carrier to overcome the additional potential barrier caused by the quasi insulating layer.

2. The solar cell as claimed in claim 1 wherein said solar cell comprises a cadmium selenide MIS solar cell containing a quasi insulating layer of zinc selenide doped with a material which forms acceptor levels in the zinc selenide or which prevents the recombination of minority carriers.

3. The solar cell as claimed in claim 2, wherein the quasi insulating layer is doped with a material selected from the group consisting of silver, antimony, gold, arsenic, and copper.

4. The solar cell as claimed in claim 3, wherein the metal layer consists of gold.

5. The solar cell as claimed in claim 2, wherein the metal layer consists of gold.

6. The solar cell as claimed in claim 1 wherein the doping materials are present in a higher concentration in the case of MIS solar cells, on the surface area adjacent to the metal layer, and in the case of SIS solar cells, on the surface area adjacent to the semiconductor layer correspnding to the metal layer.

7. The solar cell of claim 1 wherein the guasi insulating layer is doped with copper.

8. The solar cell of claim 1 wherein the insulating layer is zinc selenide doped with copper.

9. A method for making MIS or SIS solar cells having a doped quasi insulating layer comprising depositing a very thin film of the dopant material in the quasi insulating layer, and carrying out a temperature treatment thereafter.

10. The method as claimed in claim 9, wherein said solar cell is a cadmium selenide/zinc selenide MIS solar cell, the zinc selenide layer is doped with a material selected from the group consisting of silver, antimony, gold, arsenic, and copper, and wherein a single temperature treatment between 130° and 170° C. is carried out after the completion of the solar cell.

11. The method as claimed in claim 10, wherein the film made of the doping material has a thickness of 0.1–1 nm, and is applied on a zinc selenide layer having a thickness of 2–10 nm.

12. A method as in claim 11, wherein the film made of the doping material has a thickness of 0.5 nm.

13. A method as in claim 11, wherein the zinc selenide layer has a thickness of 5 nm.

14. The method of claim 10 wherein the zinc selenide layer is doped with copper.

* * * * *